United States Patent
Blazejowskyj et al.

(10) Patent No.: US 12,076,784 B1
(45) Date of Patent: Sep. 3, 2024

(54) CASTING SHELL WITH GRAIN SELECTOR SUPPORT

(71) Applicant: RTX Corporation, Farmington, CT (US)

(72) Inventors: Markian Stephan Blazejowskyj, Wethersfield, CT (US); Carl R. Verner, Windsor, CT (US); Steven J. Bullied, Pomfret, CT (US); Kevin James Pappas, Andover, NJ (US)

(73) Assignee: RTX Corporation, Farmington, CT (US)

( * ) Notice: Subject to any disclaimer, the term of this patent is extended or adjusted under 35 U.S.C. 154(b) by 0 days.

(21) Appl. No.: 18/371,732

(22) Filed: Sep. 22, 2023

(51) Int. Cl.
*B22D 27/04* (2006.01)
*B22C 9/06* (2006.01)

(52) U.S. Cl.
CPC ............ *B22D 27/045* (2013.01); *B22C 9/065* (2013.01)

(58) Field of Classification Search
CPC .............................. B22D 27/045; B22C 9/065
See application file for complete search history.

(56) References Cited

U.S. PATENT DOCUMENTS

| | | | |
|---|---|---|---|
| 4,453,588 A | 6/1984 | Goulette et al. |
| 4,475,582 A | 10/1984 | Giamei et al. |
| 4,940,073 A | 7/1990 | Jeyarajan et al. |
| 7,231,955 B1 | 6/2007 | Bullied et al. |
| 9,381,565 B2 | 7/2016 | Dillenseger et al. |
| 9,687,910 B2 | 6/2017 | Bullied et al. |
| 9,744,587 B2 | 8/2017 | Fargeas et al. |
| 10,449,605 B2 | 10/2019 | Bullied et al. |

*Primary Examiner* — Kevin P Kerns
*Assistant Examiner* — Steven S Ha
(74) *Attorney, Agent, or Firm* — Bachman & LaPointe, P.C.

(57) ABSTRACT

A casting shell has: a part cavity shaped for casting the part; a starter/selector cavity below and connected to the part cavity; a connector cavity between the starter/selector cavity and the part cavity; and a support cavity. The support cavity has: a post section; a first linking section linking the post section to the starter section of the starter/selector cavity; and a second linking section linking the post section to the connector cavity, the second linking section having a portion descending from the post section toward the connector cavity.

20 Claims, 7 Drawing Sheets

CASTING SHELL WITH GRAIN SELECTOR SUPPORT

BACKGROUND

The disclosure relates to gas turbine engines. More particularly, the disclosure relates to casting of single crystal (SX) components.

Gas turbine engines (used in propulsion and power applications and broadly inclusive of turbojets, turboprops, turbofans, turboshafts, industrial gas turbines, and the like) include single-crystal (SX) components.

To produce a single crystal casting, a grain selector is used to filter out grains to allow one dominant grain grow into the part. These grain selectors (helixes) need to be very thin and complex to properly filter and are prone to break during the shelling and casting process.

Currently ceramic rods are used to provide strength. In a similar fashion to ceramic cores, rods are placed in the pattern-molding die and pattern wax is molded over them. Rods are positioned in parallel with the grain selector. Thus, for example, a rod may have a lower end embedded in a wax section corresponding to a base of the grain starter and an upper end embedded in a wax section corresponding to a connector (between the selector and the part-forming cavity). The die encloses/masks a central portion of the rod desirably so that release from the die leaves that central portion is exposed After assembly with other pieces of the final pattern assembly, the pattern assembly is shelled. The shelling captures the central portion of the rod in the shell. The rod thus may take load off the selector portion of the pattern during die release and shelling and may take load off the selector portion of the shell during such shelling, dewaxing, and firing.

SUMMARY

One aspect of the disclosure involves a casting shell for casting a part. The casting shell comprises: a part cavity shaped for casting the part; a starter/selector section below the part cavity; a connector section; and a support cavity. The starter/selector section comprises: a starter block section having a starter block cavity; and a selector section extending upward from the starter section toward the part cavity and having a selector passageway. The connector section is between the selector passageway and the part cavity. The support section comprises: a post section having a post cavity; a first linking section linking the post section to the starter block section and having a first linking passageway; and a second linking section linking the post section to the connector section, the second linking section having second linking passageway having a portion descending from the post passageway toward the connector cavity.

A further embodiment of any of the foregoing embodiments additionally and/or alternatively includes a base cavity joining the post passageway and the starter block cavity.

In further embodiment of any of the foregoing embodiments, additionally and/or alternatively, the selector section is a spiral selector.

a further embodiment of any of the foregoing embodiments, additionally and/or alternatively, the first linking passageway has a portion descending from the post passageway toward the starter block cavity.

In a further embodiment of any of the foregoing embodiments, additionally and/or alternatively: the first linking passageway has an upper boundary having a nadir and a lower boundary having an apex at a height above the nadir; and the apex is closer to the post passageway than to the starter block cavity.

A further embodiment of any of the foregoing embodiments additionally and/or alternatively includes: a pour cone; a feed passageway linking the pour cone to the starter block cavity; and a riser passageway linking the part cavity to the pour cone above the feed passageway.

In a further embodiment of any of the foregoing embodiments, additionally and/or alternatively: the part is one of a plurality of parts; and for each of the plurality of parts, the casting shell comprises a respective said part cavity, starter/selector section, connector section, and support section.

In a further embodiment any of the foregoing embodiments, additionally and/or alternatively, the casting shell is a ceramic.

In a further embodiment of any of the foregoing embodiments, additionally and/or alternatively, the part cavity is shaped to form a blade having an attachment root and an airfoil.

In a further embodiment of any of the foregoing embodiments, additionally and/or alternatively: the first linking passageway has a central portion sloping upward from the starter block cavity to the post passageway; and the second linking passageway has a central portion sloping upward from the connector cavity to the post passageway.

In a further embodiment of any of the foregoing embodiments, additionally and/or alternatively, the casting shell lacks any pre-formed support rod(s).

In a further embodiment of any of the foregoing embodiments, additionally and/or alternatively, a casting apparatus includes the casting shell and further comprises a metallic chill plate supporting the shell along lower ends of the starter block section and the support section.

In a further embodiment of any of the foregoing embodiments, additionally and/or alternatively, the shell further contains a metallic seed in the starter block cavity.

In a further embodiment of any of the foregoing embodiments, additionally and/or alternatively, a method for manufacturing the casting shell comprises: molding a first piece having respective sections shaped to form the starter block cavity, the selector passageway, a lower section of the connector cavity, the post passageway, and the first and second linking passageways; molding a second piece shaped to form the part cavity; securing the second piece to the first piece; and shelling the combined first piece and second piece.

In a further embodiment of any of the foregoing embodiments, additionally and/or alternatively, the securing is of a plurality of said first pieces to a plurality of respective said second pieces; and the method includes assembling a plurality of wax feeder pieces to the respective first pieces.

In a further embodiment of any of the foregoing embodiments, additionally and/or alternatively, a method for using the casting shell comprises: placing the casting shell in a furnace; flowing molten alloy into the casting shell; and withdrawing the casting shell from the furnace. The withdrawing passes a solidification front upward relative to the shell so that: the solidification front passes upward from the selector passageway into the second linking section so as to block grain structure from passing from the post passageway to the part cavity.

A further aspect of the disclosure involves a casting shell for casting a part, the casting shell comprising: a part cavity shaped for casting the part; a starter/selector cavity below and connected to the part cavity; a connector cavity between the selector passageway and the part cavity; and a support cavity. The starter/selector cavity comprises: a starter block cavity; and a selector passageway extending upward from the starter section toward the part cavity. The support cavity is in communication with the starter block cavity. The shell comprises means for preventing grain structure from propagating from the support cavity into the part cavity.

In a further embodiment of any of the foregoing embodiments, additionally and/or alternatively, the means comprises: an upper passageway and a lower passageway each connecting the starter/selector cavity to the support cavity.

A further aspect of the disclosure involves a method for casting a part in casting shell, the casting shell comprising: a part cavity shaped for casting the part; a starter/selector cavity below and connected to the part cavity; a connector cavity; and a support section. The starter/selector cavity comprises: a starter cavity; and a selector passageway extending upward from the starter cavity toward the part cavity. The connector cavity is between the selector passageway and the part cavity. The support section comprises: a post passageway; and a linking passageway linking the post passageway to the connector cavity. The method comprises: introducing molten alloy to the shell; cooling the alloy so that a solidification front passes relatively upward; the solidification front passing upward in the starter cavity and selector passageway simultaneously with passing upward in the post passageway; and the solidification front passing from the selector passageway to the linking passageway so as to prevent grain structure from propagating from the post passageway into the part cavity.

In a further embodiment of any of the foregoing embodiments, additionally and/or alternatively: a base cavity joins the starter cavity and the post passageway; the linking passageway is an upper linking passageway; the support cavity comprises a lower linking passageway linking the post passageway to the starter cavity; the molten alloy flows from the starter cavity to the post passageway via the base cavity; and the solidification front passes from the starter cavity to the lower linking passageway so as to prevent grain structure from propagating from the post passageway into the part cavity via the selector passageway.

The details of one or more embodiments are set forth in the accompanying drawings and the description below. Other features, objects, and advantages will be apparent from the description and drawings, and from the claims.

BRIEF DESCRIPTION OF THE DRAWINGS

Like reference numbers and designations in the various drawings indicate like elements.

DETAILED DESCRIPTION

In a baseline ceramic rod support situation, wax may flash over the rods during the wax injection process. Upon shelling, this wax flash produces fine gaps between the rods and the portions of the shell encircling them.

Even if a gap does not extend the full height of the captured portion of the rod, a gap at the upper end captured portion will be infiltrated by molten alloy. As the solidification front rises relative to the shell, molten alloy in such gaps may solidify into additional grains which propagate into the part-forming compartment and compete with the grain from the grain selector.

Additionally, differential thermal expansion/contraction of the rods and shell may similarly create voids providing undesirable additional grains.

As an alternative to a ceramic rod, the pattern is molded with a corresponding wax section. Although this wax section creates an alternate passageway in the shell bypassing the grain selector, the geometry of this passageway is configured so that grains initiated in the passageway do not propagate into the part-forming cavity. In particular, the passageway geometry is such that a competing grain from the grain selector will block propagation of the undesirable grains from the alternate passageway to the part-forming cavity.

Although not inherently as strong as the baseline ceramic rod, the additional wax leg still provides added robustness during ejection from the die and shelling and this transitions over during dewaxing with the shell material formed over the wax leg still providing reinforcement to the shell material of the grain selector.

Figure 1:
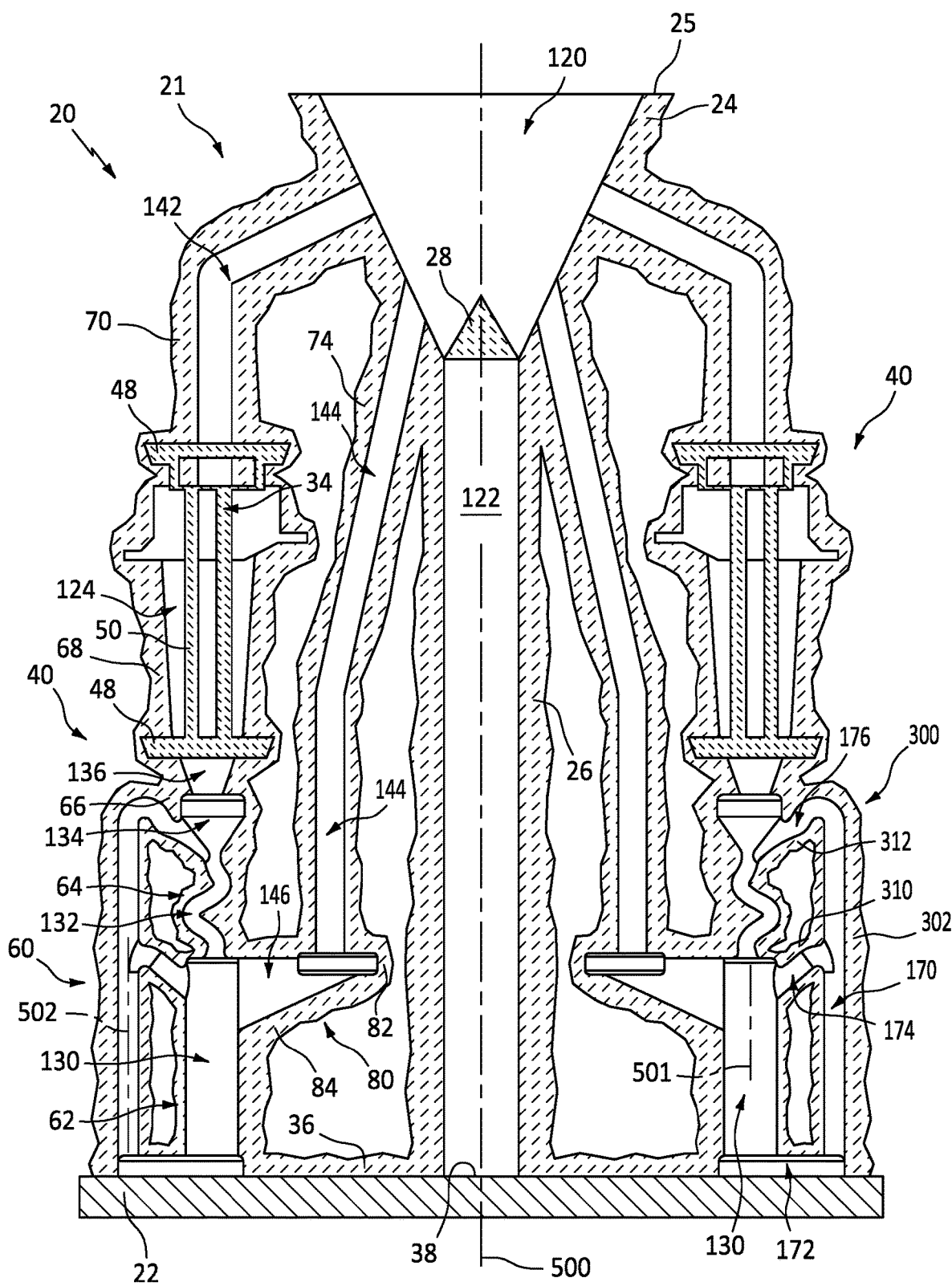
FIG. 1 is a partial, partially schematic, sectional/cutaway view of a shell cluster on a chill plate.

FIG. 1 shows a shell 20 on a chill plate 22 of a furnace. Further details of an example furnace are discussed below. The shell has an upper pour cone 24 having an upper rim/end 25 (defining/circumscribing an inlet) and supported by a central hollow post 26. A plug 28 at a base of the pour cone isolates the post interior 122 from the pour cone interior 120. The post interior has a main cylindrical portion with an axis 502. The example axis 502 is vertical.

As is discussed below, the example plug is a ceramic piece separately-formed from the shell stucco forming a shell body 21 that forms most of the rest of the shell (as are casting cores 34 discussed below separately formed ceramic and/or metallic pieces). A lower end of the post 26 is contiguous with a web 36 of shell material across an upper surface 38 of the plate and linking the post to a plurality of part-forming sections 40 of the shell.

The example shell is a cluster wherein there are a circumferential array of part-forming sections 40 surrounding the post 26 for casting respective associated parts and each fed from the pour cone. The example schematic drawing shows part-forming sections 40 to the left and right side of the drawing. Additional part-forming sections (not shown) may be beneath the plane of the drawing and above the plane of the drawing with example numbers of sections distributed at generally even angular intervals about central longitudinal/vertical axis 500. An example number of sections 40 per cluster is three to thirty. Each of the part-forming sections 40 has a part-forming cavity 124 formed by an associated portion of the shell.

The example cluster consists of the single stucco piece plus the plug and casting cores. Alternative embodiments may have multiple stucco or other pieces such as might be formed by separately shelling part forming sections which may include associated feeders and/or risers. A plurality of such separate sections may then be assembled and mated with a separately-formed pour cone (itself formed by shelling a wax pattern or cast). Example stucco is silica, alumina, zirconia or combinations thereof.

In an example investment casting process for casting a plurality of gas turbine engine blades, each blade (or other article) is cast in an associated cavity 124. Thus, the cavity has portions for forming the blade attachment root (e.g., firtree or dovetail) and airfoil and optionally platform intervening between root and airfoil. In this example of a hollow blade, the casting core 34 has portions 48 partially embedded in the shell stucco and has exposed sections 50 within the cavity 124 so as to cast internal blade passageways through the root into the airfoil.

The shell includes, for each part-forming section 40, a starter/selector section (subsection) 60. The starter/selector section 60 includes a starter block section 62 having a starter block cavity 130 extending upward from the chill plate 22. The starter/selector section further includes a selector section 64 having a grain selector (single crystal selector) passageway 132 extending upward from an upper end of the starter block cavity 130. The example grain selector passageway 132 is a helical selector. The selector has a central axis or centerline 501 which is vertical in the illustrated example. The example selector is a spiral helix rather than a pure helix. In a pure helix, the centerline of the selector passageway would fall entirely along a right circular cylindrical surface. In the spiral helix, upper and lower terminal portions spiral inward to the axis or centerline 501 as is common in the art.

A connector section or region 66 of the shell extends upward from the grain selector 64 to the part-forming cavity 124 shell section 68. As is discussed further below, the example connector region 66 has a connector cavity having two main cavity sections initially molded over two joined pattern pieces: a lower cavity section 134; and an upper cavity section 136. In the particular blade example, the upper cavity section 136 is below a portion of the cavity 124 at the ultimate airfoil tip. A vent or riser section 70 having a riser passageway 142 extends upward from an upper end of the part-forming section 68/cavity 134 to a port on the pour cone relatively high on the pour cone.

A feeder section 74 and feeder (feed) passageway 144 extend from a port relatively low on the pour cone toward the starter block section 62 and starter block cavity 130. A feeder transition section 80 of the shell with transition passageway 146 is an artifact of pattern manufacture and includes an upper section 82 and a lower section 84. The upper section is transversely elongate and the lower section transitions in buttress-like fashion to the starter section/cavity 62/130.

However, additionally, the shell includes a support section 300 having a hollow post section 302 structurally in parallel with the grain selector section 64 for reinforcement. Specifically, the post section forms/bounds a hollow cavity or passageway 170 extending up from a protruding base cavity 172 joining the starter block cavity.

The support section 300 includes a lower linking portion 310 (having a lower linking passageway 174) connecting directly to an upper region of the starter cavity and an upper linking portion 312 (having upper linking passageway 176) connecting to the grain selector section. They both extend downward from the post passageway 170 of the support portion.

The lower linking passageway 174 intersects an intermediate portion of a vertical section of the post vertical passageway 170. The example upper linking passageway has a terminal rather than intermediate intersection joining the upper end of the post passageway 170 at a turn. The lower linking passageway 174 and upper linking passageway 176 each have an upper boundary 192 (FIG. 6) and a lower boundary 190 viewed in section. Due to the downward inclination from the post passageway (upward inclination from the starter cavity) the lower boundary reaches an apex 191 near a junction with the support cavity 170 and the upper boundary reaches a nadir or low point 193 near the starter block cavity 130 or connector 134, respectively. As is discussed below, the lower boundary apex 191 is advantageously higher than the associated upper boundary nadir 192 so that as the solidification front passes relatively upward, it will reach the nadir first and therefore cause a portion of the linking passageway to be plugged by material crystalized from the starter block cavity or connector, respectively, rather than from the post passageway 170. Example height difference is nonzero, for example at least 0.5 mm or at least 1.0 mm. To create example ranges using any of those lower limits, example upper limits are 5.0 mm or 10.0 mm to 20.0 mm.

The downward direction prevents grains from the support section 300 post section 302 from passing back into the starter block cavity and grain selector. With ports at each end of each linking passageway, by the time the solidification front has reached the port on the post passageway 170, it has already passed the opposite port on the starter cavity 130. Thus, grains may only pass from the starter cavity through the lower passageway and from the grain selector through the upper passageway but not in the opposite direction.

Figure 2:
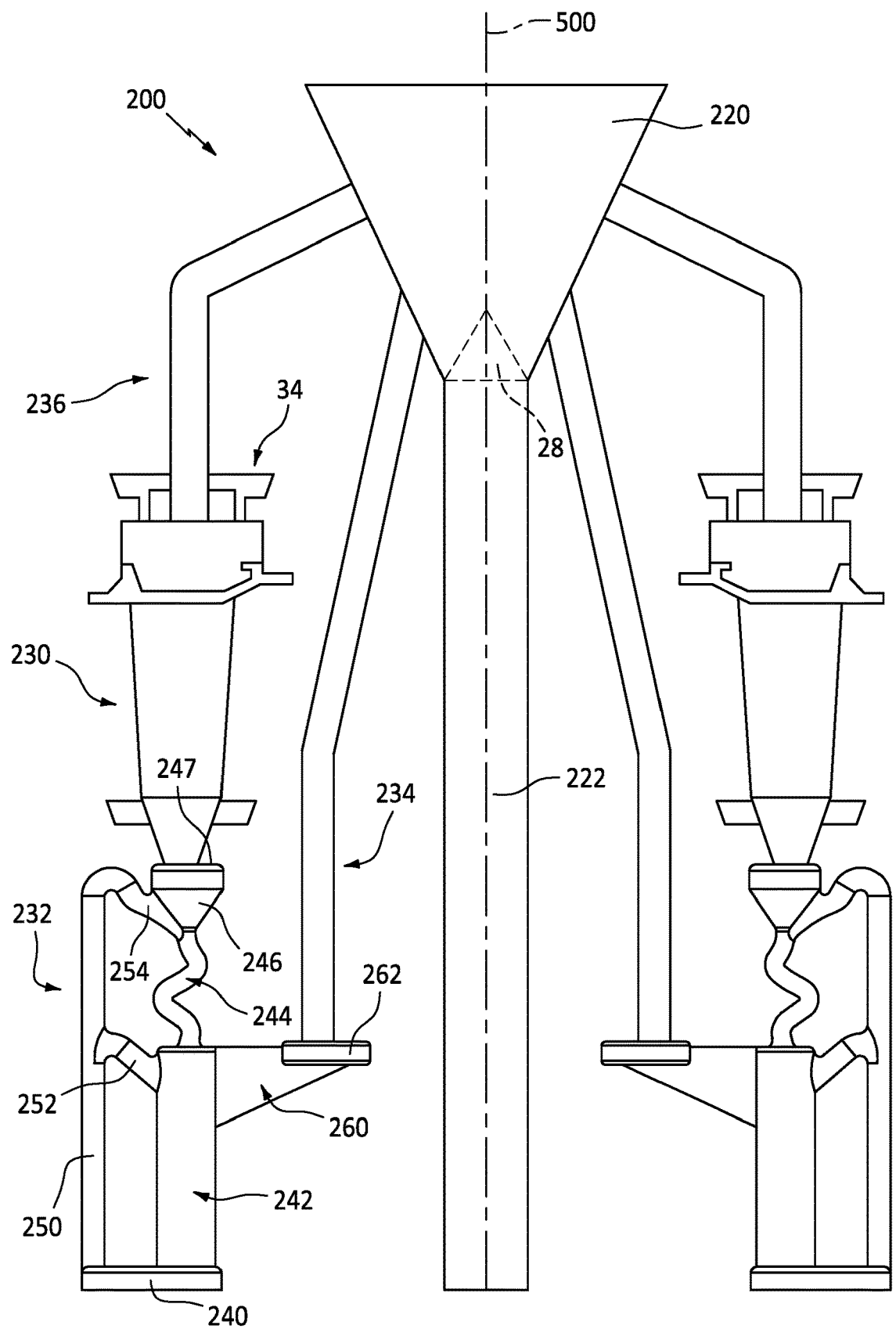
FIG. 2 is a partial, partially schematic, view of a pattern assembly for forming the shell cluster.

FIG. 2 shows a pre-shelling pattern assembly 200 for forming the shell 20 of FIG. 1. The assembly has a pour cone section 220 and a post section 222. These may be initially molded as separate wax pieces or co-molded with the example plug 28 potentially being overmolded in the molding of one or both. The plug 28 may itself be of a molded ceramic. An example pour cone is frusto-conical having a larger diameter upper end than lower end. The example post 222 is right circular cylindrical extending from an upper end to a lower end. For each part to be cast, there is a separate pattern 230. The pattern 230 has surfaces corresponding to key surfaces of the part and may have one or more at least partially embedded cores 34. Each pattern is supported atop a starter/selector/support piece 232. Each starter/selector/support is coupled by a feeder piece 234 to the pour cone. In this example, each pattern 230 is coupled to a vent or riser piece or assembly 236. The example vent piece or assembly connects to the pour cone section 220 at a height above the connection of the feeder 234.

The starter/selector/support piece 232 has: a base section 240 for forming the base cavity 172; a starter section 242 extending upward from the base section for forming the starter cavity 130; a selector section 244 extending upward from the starter section for forming the selector passageway 132 and a connector/weld pad section 246 having an upper surface 247. A connector tip section of the pattern is wax welded to the surface 247. The section 246 has a divergent frustoconical section extending from an upper end of the selector section 244 and a generally cylindrical section thereabove.

FIG. 2. Also shows post section 250 and lower 252 and upper 254 linking sections and a buttress section 260 and feeder weld pad section 262 for forming corresponding sections of the shell and associated cavities.

Figure 6:
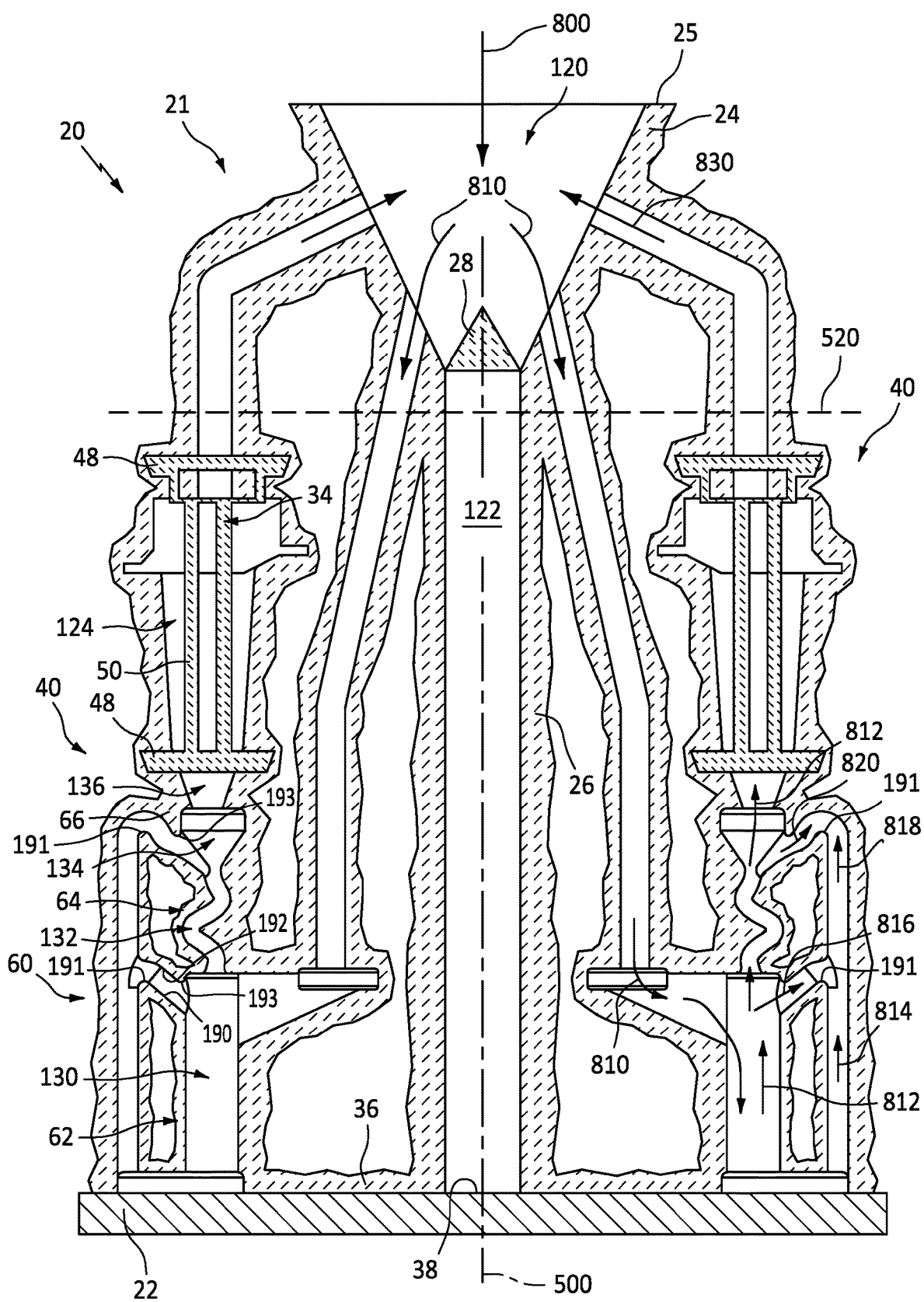
FIG. 6 is a view of the shell cluster of FIG. 1 showing flow paths/flows.

FIG. 6 shows an inlet flow 800 of molten alloy from a crucible (not shown) to the pour cone splitting into a plurality of feeder flows 810 to the respective sections 40. The feeder flows pass through respective pour cone outlets into the feeder tubes and then pass to the respective starter. Flow initially accumulates at the base 172 of the starter and then proceeds upward as branches 812 and 814 respectively through the starter cavity 130 itself and the support cavity 170.

A flow branch 816 passes upward from the starter cavity into the lower linking passageway 174 to merge with flow 814 in the support cavity as flow 818. Continuing upward, the (remaining) flow 812 passes through the selector passageway 132 into the connector 134, 136 and therefrom into the part-forming cavity enveloping the core (if any) and continuing upward. A further branch flow 820 branches from the flow 812 at the connector to pass through the upper linking passageway 176 and merge with the flow 818.

All during this process, a vent flow 830 of air or other gas (if any) may pass outward (e.g., via the vent/riser 142 to the upper ports on the pour cone in this particular example). Eventually the level of the molten alloy will reach a predetermined level 520 above the top of the part-forming cavities 124. Depending on implementation, the pour may actively be stopped at this point, or the pour may simply be preselected to have a volume that will yield this point. Depending on implementation, the level 520 may be shy of (below) the pour cone so that separate bodies of alloy are formed for each of the sections of the cluster. In other embodiments, the level 520 may be in the pour cone so that a single continuous molten alloy body (and subsequent solidified body) exists. For example, FIG. 7 shows a series of stages of solidification as the shell is withdrawn from the furnace.

Figure 7:
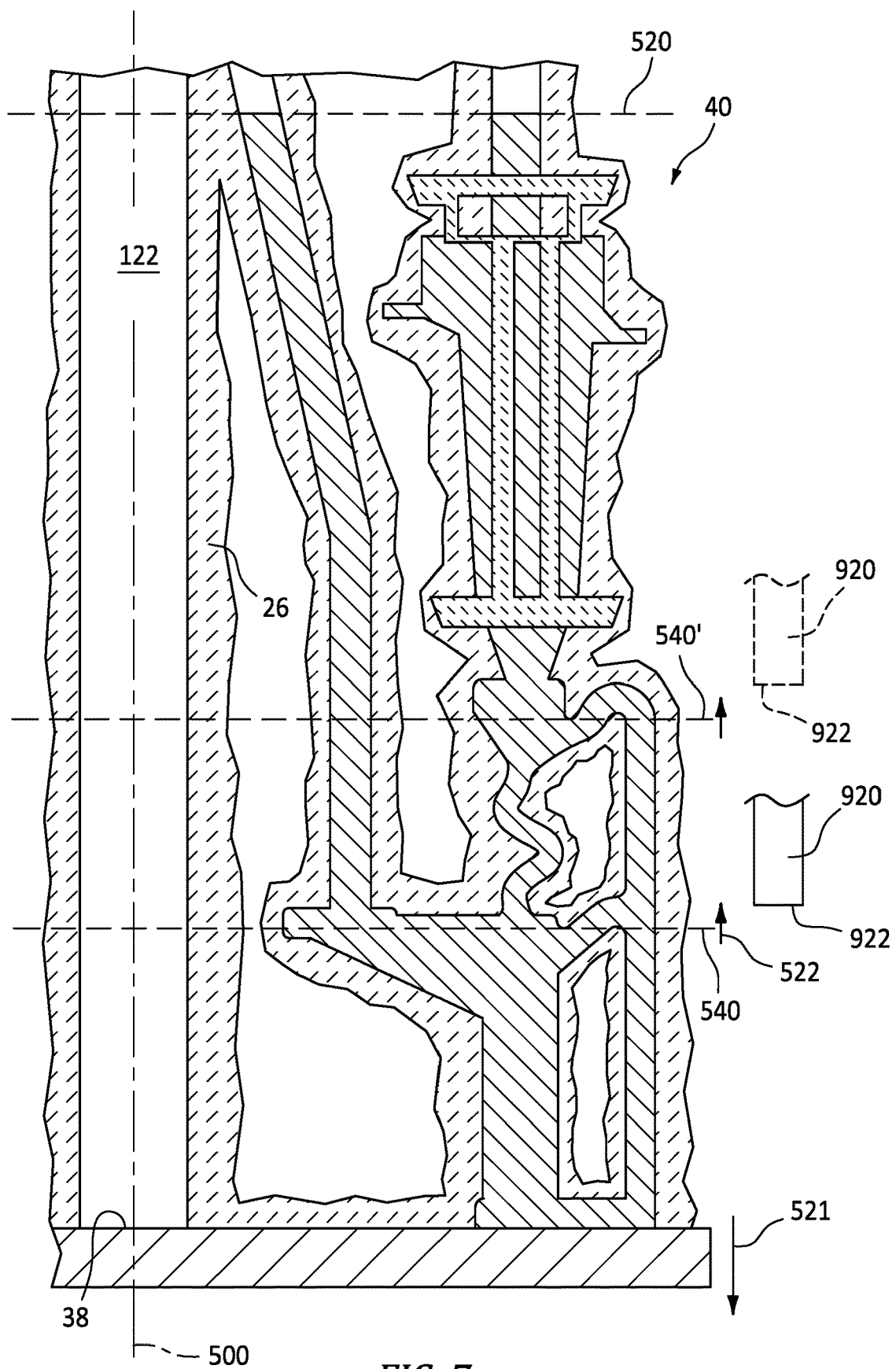
FIG. 7 is an enlarged view of a region of the shell cluster for a single cast component showing solidification front progress as the shell cluster is withdrawn from a furnace.

FIG. 7 shows a lower end portion of the furnace sidewall 920 with a lower rim 922 defining lower opening through which the chill plate is withdrawn downward (movement direction 521) carrying the shell. As the shell is withdrawn, a solidification front 540, 540' passes upward (direction 522) relative to the shell (even though the solidification front may be at generally constant height relative to the foundry and furnace).

FIG. 7 shows a solid line condition wherein the solidification front 540 has reached an apex of the bottom boundary of the lower linking passageway 174. At this point, solidification of grains in the grain starter section has propagated into the lower linking passageway has either reached the lower extreme 193 of the upper boundary 192 or is close thereto. At this point, no grains in the post passageway 170 have been able to propagate into the lower linking passageway and, with further withdrawal, none will be as they will have been blocked by the already-solidified material.

With further withdrawal, the solidification front passes into and through the grain selector passageway 132 so that on reaching the top of the grain selector passageway (broken line showing and level 540'), a single grain has been selected. Similarly to the blocking of the lower linking passageway, further withdrawal causes this now single grain to propagate into the upper linking passageway. Again, by the time the solidification front has reached the lower boundary 190 apex 191 of the upper linking passageway 176, the upper linking passageway is effectively blocked so that the grains from the post passageway cannot pass to the part-forming cavity. Thus, further withdrawal causes the single selected grain to pass through the connector and into the part-forming cavity.

A relevant benefit is that larger parts will be able to be supported by a thin and complex grain selector. Grains will not kick off from the wax flash on the ceramic rods used previously. The ceramic rod will not need to be inserted into the wax injection die which will save on cost and remove the ability to damage the die. Related and/or different benefits may relate to issues of differential thermal or other expansion of the shell material and rod material. Alternatively/additionally, this may produce stresses that can damage the shell and compromise its integrity. Relatedly, lesser damage may include causing debonding of the shell and ceramic rod creating voids which may cause spurious grain formation in similar fashion added to that produced by the voids associated with wax flash.

Component materials and manufacture techniques and assembly techniques may be otherwise conventional.

Figure 8:
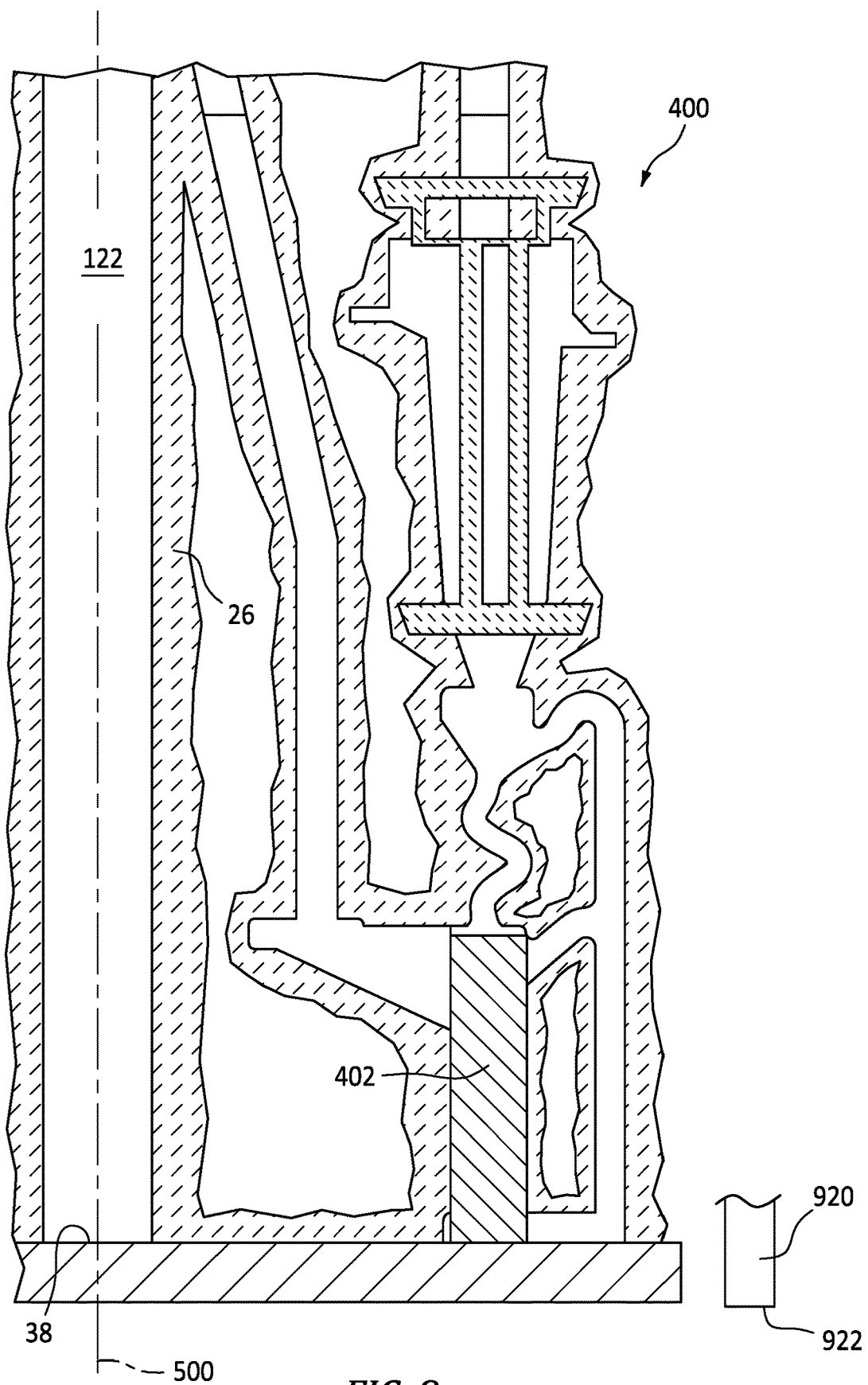
FIG. 8 is an enlarged view of a region of a seed-containing shell cluster for a single cast component.

Among other variations, the support and linking sections may be used with shell configurations featuring single crystal seeds. In such a situation, the seed would likely be located in space otherwise occupied by the starter (see seed 402 of shell section 400 of FIG. 8).

In some examples, the seed may be part of the shelled structure. For example, the seed may be inserted in the wax-molding die for molding a starter/selector/support otherwise similar to the FIG. 3 piece 232 resulting in an alloy-wax starter/selector/support assembly or combination. Thus, a lower part of the seed may be laterally embedded in the FIG. 3 base section 240. In other examples, the seed may be inserted into the shell after forming the shell over the wax and dewaxing.

Figure 3:
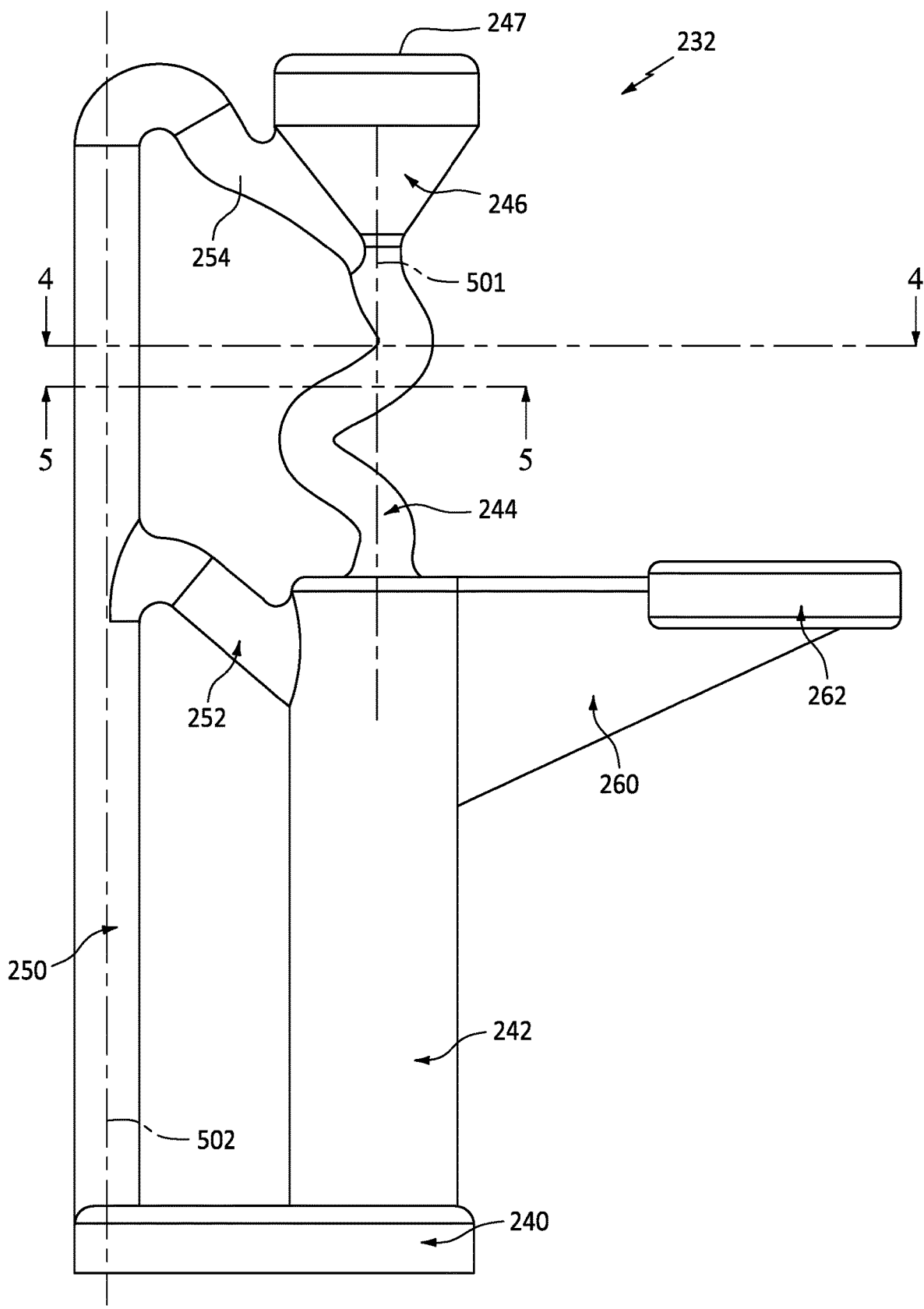
FIG. 3 is a view of a starter/selector section/piece of the pattern assembly.
Figure 4:
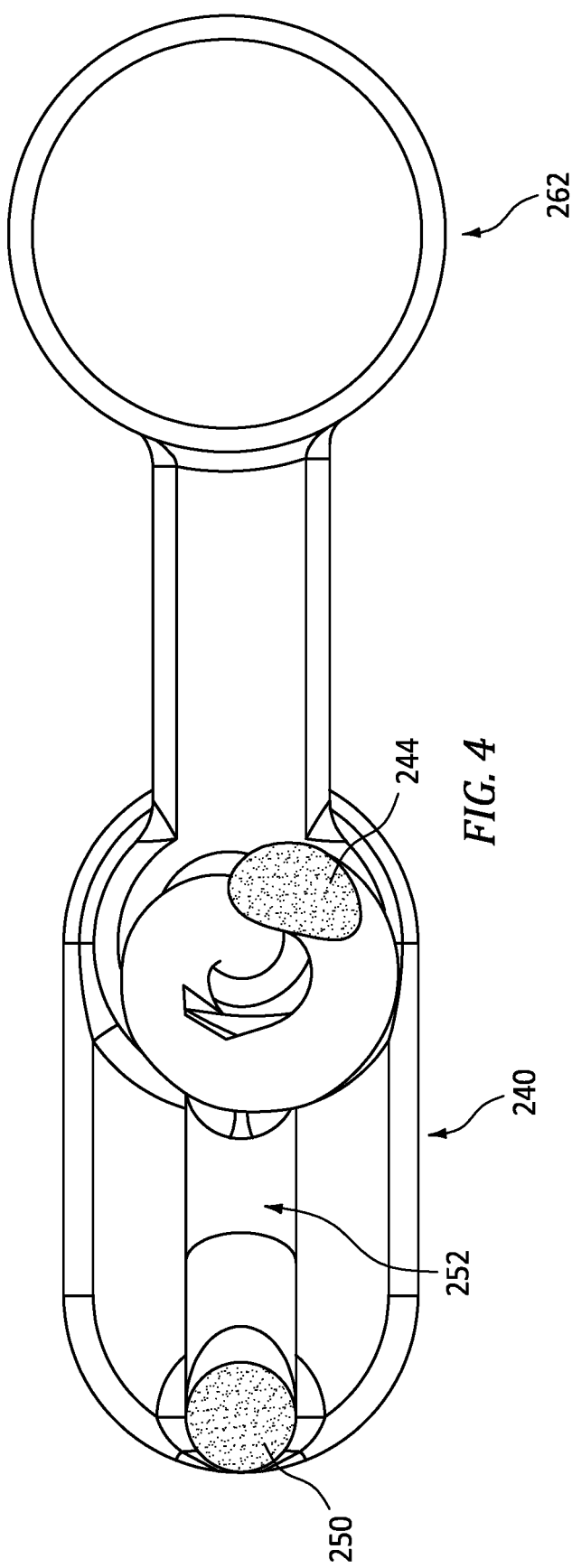
FIG. 4 is a downward transverse sectional view of the starter/selector of FIG. 3, taken along line 4-4.
Figure 5:
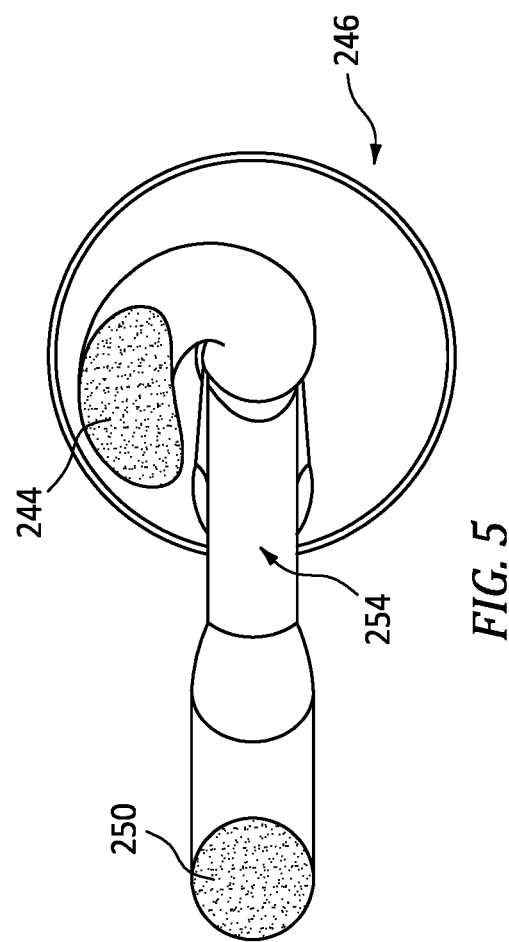
FIG. 5 is an upward transverse sectional view of the starter/selector of FIG. 3, taken along line 5-5.

Although like the FIG. 3 starter, the general transverse cross-section of the seed may be circular, seed manufacture may make other sections advantageous such as square or rectangular (e.g., so they may be cut from larger pieces). Example square sections have rounded corners (e.g., ground).

Also, the feeder connection could be shifted (not shown) to above the selector helix. In some such implementations, the seed (a lower portion of which does not melt) may block direct flow to the support cavity along the chill plate. However, there may still be flow via the linking passages. Thus, the dynamics of the solidification front may be the same.

Yet other variations involve selectors whose axes 501 are off-vertical. Such are known for use in casting vanes using correspondingly tilted seeds in "oblique seeding" casting. Thus, example helix axes 501 may be up to about 40° off-vertical. For such off-vertical helixes, the posts (or main sections thereof) may still be vertical.

The use of "first", "second", and the like in the following claims is for differentiation within the claim only and does not necessarily indicate relative or absolute importance or temporal order. Similarly, the identification in a claim of one element as "first" (or the like) does not preclude such "first" element from identifying an element that is referred to as "second" (or the like) in another claim or in the description.

One or more embodiments have been described. Nevertheless, it will be understood that various modifications may be made. For example, when applied to an existing baseline part or shell configuration or baseline shell manufacture process or casting apparatus or process, details of such baseline(s) may influence details of particular implementations. Accordingly, other embodiments are within the scope of the following claims.

What is claimed is:

1. A casting shell for casting a part, the casting shell comprising:
 a part cavity shaped for casting the part;
 a starter/selector section below the part cavity and comprising:
  a starter block section having a starter block cavity; and a selector section extending upward from the starter section toward the part cavity and having a selector passageway;
a connector section having a connector cavity between the selector passageway and the part cavity; and
a support section comprising:
  a post section having a post passageway;
  a first linking section linking the post section to the starter block section and having a first linking passageway; and
  a second linking section linking the post section to the connector section, the second linking section having a second linking passageway having a portion descending from the post passageway toward the connector cavity.

2. The casting shell of claim 1 further comprising:
a base cavity joining the post passageway and the starter block cavity.

3. The casting shell of claim 1 wherein:
the selector section is a spiral selector.

4. The casting shell of claim 1 wherein:
the first linking passageway has a portion descending from the post passageway toward the starter block cavity.

5. The casting shell of claim 1 wherein:
the first linking passageway has an upper boundary having a nadir and a lower boundary having an apex at a height above the nadir; and
the apex is closer to the post passageway than to the starter block cavity.

6. The casting shell of claim 1 further comprising:
a pour cone;
a feed passageway linking the pour cone to the starter block cavity; and
a riser passageway linking the part cavity to the pour cone above the feed passageway.

7. The casting shell of claim 1 wherein:
the part is one of a plurality of parts; and
for each of the plurality of parts, the casting shell comprises a respective said part cavity, starter/selector section, connector section, and support section.

8. The casting shell of claim 1 wherein:
the casting shell is a ceramic.

9. The casting shell of claim 1 wherein:
the part cavity is shaped to form a blade having an attachment root and an airfoil.

10. The casting shell of claim 1 wherein:
the first linking passageway has a central portion sloping upward from the starter block cavity to the post passageway; and
the second linking passageway has a central portion sloping upward from the connector cavity to the post passageway.

11. The casting shell of claim 1 wherein the casting shell lacks any pre-formed support rod(s).

12. A casting apparatus including the casting shell of claim 1 and further comprising:
a metallic chill plate supporting the shell along lower ends of the starter block section and the support section.

13. The casting apparatus of claim 12 wherein:
the shell further contains a metallic seed in the starter block cavity.

14. A method for manufacturing the casting shell of claim 1, the method comprising:
molding a first piece having respective sections shaped to form the starter block cavity, the selector passageway, a lower section of the connector cavity, the post passageway, and the first and second linking passageways;
molding a second piece shaped to form the part cavity;
securing the second piece to the first piece; and
shelling the combined first piece and second piece.

15. The method of claim 14 wherein:
the securing is of a plurality of said first pieces to a plurality of respective said second pieces; and
the method includes assembling a plurality of wax feeder pieces to the respective first pieces.

16. A method for using the casting shell of claim 1, the method comprising:
placing the casting shell in a furnace;
flowing molten alloy into the casting shell; and
withdrawing the casting shell from the furnace,
wherein:
  the withdrawing passes a solidification front upward relative to the shell so that:
    the solidification front passes upward from the starter/selector cavity into the second linking passageway so as to block grain structure from passing from the post passageway to the part cavity.

17. A casting shell for casting a part, the casting shell comprising:
a part cavity shaped for casting the part;
a starter/selector cavity below and connected to the part cavity and comprising:
  a starter block cavity; and
  a selector passageway extending upward from the starter section toward the part cavity;
a connector cavity between the selector section passageway and the part cavity;
a support cavity in communication with the starter block cavity; and
means for preventing grain structure from propagating from the support cavity into the part cavity.

18. The casting shell of claim 17 wherein the means comprises:
an upper passageway and a lower passageway each connecting the starter/selector cavity to the support cavity.

19. A method for casting a part in casting shell, the casting shell comprising:
a part cavity shaped for casting the part;
a starter/selector cavity below and connected to the part cavity and comprising:
  a starter cavity; and
  a selector passageway extending upward from the starter cavity toward the part cavity;
a connector cavity between the selector passageway and the part cavity; and
a support section comprising:
  a post passageway;
  a linking passageway linking the post passageway to the connector cavity,
the method comprising:
introducing molten alloy to the shell;
cooling the alloy so that a solidification front passes relatively upward;
the solidification front passing upward in the starter cavity and selector passageway simultaneously with passing upward in the post passageway; and
the solidification front passing from the selector passageway to the linking passageway so as to prevent grain structure from propagating from the post passageway into the part cavity.

20. The method of claim 19 wherein:
a base cavity joins the starter cavity and the post passageway;
the linking passageway is an upper linking passageway;
the support section comprises a lower linking passageway linking the post passageway to the starter cavity;
the molten alloy flows from the starter cavity to the post passageway via the base cavity; and
the solidification front passes from the starter cavity to the lower linking passageway so as to prevent grain structure from propagating from the post passageway into the part cavity via the selector passageway.

\* \* \* \* \*